(12) United States Patent
Chan et al.

(10) Patent No.: US 6,706,591 B1
(45) Date of Patent: Mar. 16, 2004

(54) METHOD OF FORMING A STACKED CAPACITOR STRUCTURE WITH INCREASED SURFACE AREA FOR A DRAM DEVICE

(75) Inventors: Bor-Wen Chan, Hsin-Chu (TW); Huan-Just Lin, Hsin-Chu (TW); Hun-Jan Tao, Hsinchu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 213 days.

(21) Appl. No.: 10/054,561

(22) Filed: Jan. 22, 2002

(51) Int. Cl.⁷ .......................................... H01L 21/8242
(52) U.S. Cl. ................... 438/255; 438/396; 438/398; 438/399; 438/719
(58) Field of Search .............................. 438/393–399, 438/706, 719, 720

(56) References Cited

U.S. PATENT DOCUMENTS

| | | | | |
|---|---|---|---|---|
| 5,670,405 A | | 9/1997 | Tseng ........................... | 437/52 |
| 5,691,221 A | | 11/1997 | Jun .............................. | 437/52 |
| 5,763,286 A | * | 6/1998 | Figura et al. .................. | 437/60 |
| 5,801,089 A | | 9/1998 | Kenney ....................... | 438/589 |
| 5,923,989 A | | 7/1999 | Lin et al. ..................... | 438/398 |
| 6,025,225 A | | 2/2000 | Forbes et al. ................ | 438/243 |
| 6,057,205 A | | 5/2000 | Wu ............................. | 438/398 |
| 6,218,243 B1 | * | 4/2001 | Tan et al. .................... | 438/255 |
| 6,376,326 B1 | * | 4/2002 | Lou ............................ | 438/396 |
| 6,399,440 B1 | * | 6/2002 | Miao .......................... | 438/255 |
| 6,432,772 B1 | * | 8/2002 | Wu et al. .................... | 438/255 |
| 6,555,431 B1 | * | 4/2003 | Xing et al. .................. | 438/253 |

* cited by examiner

Primary Examiner—Nadine G. Norton
Assistant Examiner—Duy-Vu Deo
(74) Attorney, Agent, or Firm—George O. Saile; Stephen B. Ackerman

(57) ABSTRACT

A process for forming a DRAM stacked capacitor structure with increased surface area, has been developed. The process features forming lateral grooves in the sides of a polysilicon storage node structure, during a dry etching procedure used to define the storage node structure. The grooves are selectively, and laterally formed in ion implanted veins, which in turn had been placed at various depths in an intrinsic polysilicon layer via a series of ion implantation steps, each performed at a specific implant energy. An isotopic component of the storage node structure, defining dry etch procedure, selectively etches the highly doped, ion implanted veins at a greater rate than the non-ion implanted regions of polysilicon, located between the ion implanted veins, resulting in a necked profile, storage node structure, featuring increase surface area as a result of the formation of the lateral grooves.

27 Claims, 4 Drawing Sheets

METHOD OF FORMING A STACKED CAPACITOR STRUCTURE WITH INCREASED SURFACE AREA FOR A DRAM DEVICE

BACKGROUND OF THE INVENTION (1) Field of the Invention

The present invention relates to methods used to fabricate semiconductor devices, and more specifically to a method used to form a stacked capacitor structure, with increased surface area, for a dynamic random access memory (DRAM) device.

(2) Description of Prior Art

Micro-miniaturization, or the ability to fabricate semiconductor devices using sub-micron features, have allowed the performance of these semiconductor devices to be unproved while still decreasing the processing cost of a specific sub-micron device. Dimension reduction, realized via the use of sub-micron features, has resulted in decreases in performance degrading parasitic capacitances. In addition the use of sub-micron features have resulted in a greater number of smaller semiconductor chips attainable from a specific size starting substrate, with device densities of the smaller semiconductor chips still equal to or greater than counterpart larger semiconductor chips fabricated using larger dimensions, thus allowing the processing cost for a specific semiconductor chip to be reduced. However in the area of DRAM technology, the decreasing size of the transfer gate transistor limits the horizontal dimension of an overlying DRAM capacitor structure. To continually increase device performance capacitance increases, or increases in the ice area of the capacitor structure, have to be achieved, however without increasing the horizontal dimension of the capacitor structure. The increased surface area for DRAM stacked capacitor structures, are usually achieved via unique geometric configurations such as crown, cylindrical or fin shaped structures in which additional vertical features are formed as part of the stacked capacitor structure. However to achieve these unique configurations rigorous and complex process sequences are needed, adding additional process cost.

This invention will teach a method of forming a stacked capacitor structure offering increased surface area, however without forming the complex vertical and protruding horizontal features comprised in the crown, cylindrical or fin type structure. This invention will feature a "necked" profile for a capacitor structure, comprised with necked regions, or lateral grooves located in, and extending from, the sides of capacitor storage node structure. The necked capacitor profile, obtained via multiple ion implantation procedures into, and conventional dry etching of, a storage node structure, can result in a capacitor structure exhibiting a surface area of about 3 times greater than a surface area achieved with flat surfaces. Prior art, such as Forbes et al, in U.S. Pat. No. 6,025,225, describe a method of roughening the surface of a trench capacitor structure, while Jun in U.S. Pat. No. 5,691,221, describe a method of forming a fin type, stacked capacitor structure. However neither of these prior arts describe a process for forming the novel, capacitor structure, featuring the necked profile, now described in this present invention.

SUMMARY OF THE INVENTION

It is an object of this invention to fabricate a DRAM device, on a semiconductor substrate.

It is another object of this invention to form a DRAM stacked capacitor structure, featuring a storage node structure with a necked profile, employed to increase the capacitor surface area.

It is still another object of this invention to form the necked profile, for the DRAM capacitor structure, via multiple ion implantation procedures, performed at various energies, placing groups of implanted ions at specific depths in a polysilicon storage node structure, followed by a dry etch procedure which laterally removes the implanted regions at a greater rate than the non-implanted regions of the storage node structure, resulting in the desired grooves, or the necked profile, for the polysilicon storage node structure of the DRAM capacitor device.

In accordance with the present invention a method of fabricating a DRAM capacitor structure, comprised with a storage node structure featuring a necked profile, used for surface area increases, is described. After formation of an underlying transfer gate transistor, a storage node plug structure is formed in an insulator layer, overlying and contacting a portion of a top surface of the transfer gate transistor source/drain region. An intrinsic polysilicon layer is deposited on the top surface of the insulator layer, overlying and contacting the top surface of the storage node plug structure. A series of ion implantation procedures is performed at multiple implant energies, placing layers of implanted ions in specific regions of the intrinsic polysilicon layer, with intrinsic, or non-implanted regions of polysilicon located between the implanted regions. A dry etch procedure is used to vertically define the polysilicon storage node structure, with the dry etch procedure also laterally, and selectively removing portions of the implanted regions located at the outside surface of the defined storage node structure, resulting in the necked profile storage node structure. After deposition of a capacitor dielectric layer on the necked profile, storage node structure, an upper electrode is formed resulting in a DRAM capacitor structure featuring increased sure area as a result of formation of the storage node structure with the necked profile.

BRIEF DESCRIPTION OF THE DRAWINGS

The object and other advantages of this invention are best described in the preferred embodiment with reference to the attach drawings that include.

DESCRIPTION OF THE PREFERRED EMBODIMENTS

Figure 1:
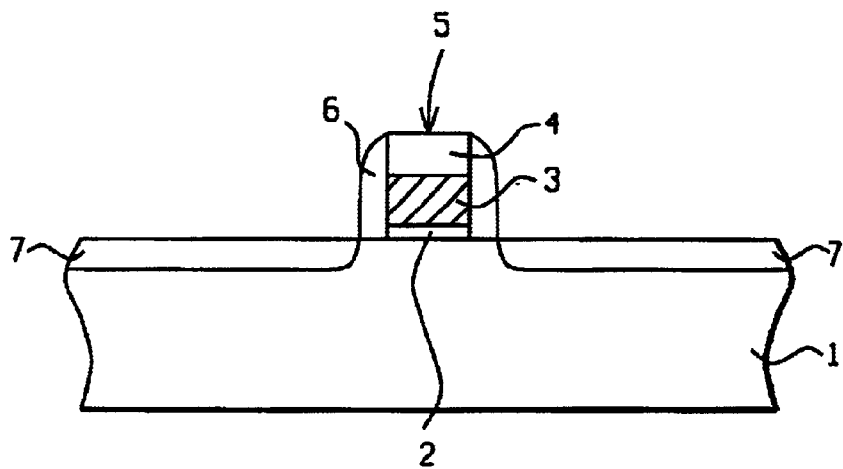
FIGS. 1–6, which schematically, in cross sectional style, describe key stages of fabrication used to fabricate a DRAM capacitor structure, featuring a storage node structure formed with a necked profile, designed to increase capacitor surface area.

The method of fabricating a DRAM capacitor structure, featuring a storage node structure formed with a necked profile, designed to increase capacitor surface area, will now be described in detail. Semiconductor substrate 1, comprised of P type, singe crystalline silicon, featuring a <100> crystallographic orientation, is used and schematically shown in FIG. 1. Silicon dioxide gate insulator layer 2, is thermally grown to a thickness between about 15 to 100 Angstroms, followed by the formation of silicon nitride capped, polycide gate structure 5. Polycide layer 3, is comprised of an overlying metal silicide layer such as tungsten silicide, and an underlying, in situ doped, polysilicon layer 3. The underlying polysilicon layer is obtained via low pressure chemical vapor deposition (LPCVD), procedures, at a thickness between about 200 to 2000 Angstroms, and doped during deposition via the addition of arsine or phosphine, to a silane ambient. The overlying tungsten silicide layer is also obtained via LPCVD procedures, at a thickness between about 200 to 2000 Angstroms, using silane and tungsten hexafluoride as reactants. Silicon nitride layer 4, is then deposited at a thickness between about 100 to 1000 Angstroms, via LPCVD or plasma enhanced chemical vapor deposition (PECVD) procedures. A photoresist shape, not shown in the drawings, is used as an mask to allow an anisotropic, reactive ion etching (RIE) procedure, using $Cl_2$ as an etchant, to define silicon nitride capped, polycide gate structure 5, shown schematically in FIG. 1. The width of silicon nitride capped, polycide gate structure 5, is between about 100 to 1000 Angstroms.

After removal of the photoresist shape used for definition of the silicon nitride capped, polycide gate structure, via plasma oxygen ashing procedures, insulator spacers 6, on formed on the sides of silicon nitride capped, polycide gate structure 5. This is accomplished via deposition of a silicon nitride, or a silicon oxide layer, via LPCVD or PECVD procedures, at a thickness between about 100 to 1500 Angstroms. An anisotropic RIE procedure, using $CF_4$ as an etchant is next used to form silicon nitride, or silicon oxide spacers on the sides of silicon nitride capped, polycide gate structure 5. Arsenic or phosphorous ions are next implanted into a region of semiconductor substrate 1, not covered by silicon nitride capped, polycide gate structure 5, or by insulator spacers 6, at an energy between about 2 to 100 KeV, at a dose between about 2E13 to 7E14 atoms/$cm^2$. An anneal procedure is next performed using either conventional furnace or rapid thermal anneal procedures, to activate the implanted ions, forming N type source/drain region 7, shown schematically in FIG. 1. Although this invention is described for a N channel device, it can also be applied to a channel device.

Figure 2:
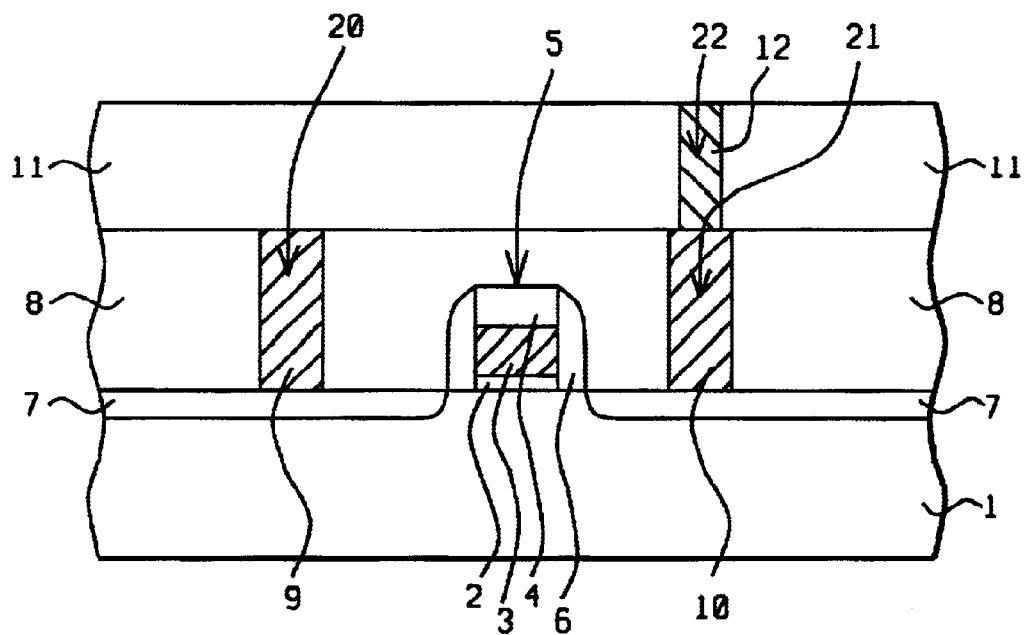

Insulator layer 8, such as silicon oxide, or borophosphosilicate glass (BPSG), is next deposited at a thickness between about 3000 to 12000 Angstroms, via LPCVD or PECVD procedures. Planarization of insulator layer 8, is then accomplished via a chemical mechanical polishing (CMP) procedure, resulting in a smooth top surface topography for insulator layer 8. Photolithographic and anisotropic RIE procedures, using $CHF_3$ as an etchant, are used to define openings 20, and 21, insulator layer 8, each now exposing a top portion of source/drain region 7. After removal of the photoresist shape used to define openings 20, and 21, via plasma oxygen ashing procedures a polysilicon layer is deposited via LPCVD procedures, at a thickness between about 3000 to 12000 Angstroms, completely filling openings 20, and 21. The polysilicon layer is doped in situ during deposition, via the addition of arsine or phosphine to a silane ambient. Regions of unwanted polysilicon, located on the top surface of insulator layer 8, are then removed via CMP procedures, or via a selective RIE procedure using $Cl_2$ or $SF_6$ as an etchant, defining lower polysilicon storage node plug structure 10, in opening 21, and polysilicon bit line plug structure 9, located in opening 20. Insulator layer 11, again comprised of either silicon oxide, or BPSG, is next deposited via LPCVD or PECVD procedures, at a thickness between about 3000 to 12000 Angstroms, followed by photolithographic and anisotropic RIE procedures, using $CHF_3$ as an etchant, resulting in the definition of opening 22, exposing a portion of the top surface of lower polysilicon storage node plug structure 10. After removal of the photoresist shape used to define opening 22, another N type, in situ doped polysilicon layer is deposited via LPCVD procedures, at a thickness between about 1000 to 7000 Angstroms, completely filling opening 22. Removal of unwanted portions of the polysilicon layer is next accomplished via CMP or selective RIE procedures, resulting in the formation of upper polysilicon storage node plug structure 12, located in opening 22, overlying and contacting a portion of the top surface of lower polysilicon storage node plug structure 10. The result of these procedures is schematically shown in FIG. 2.

Figure 3:
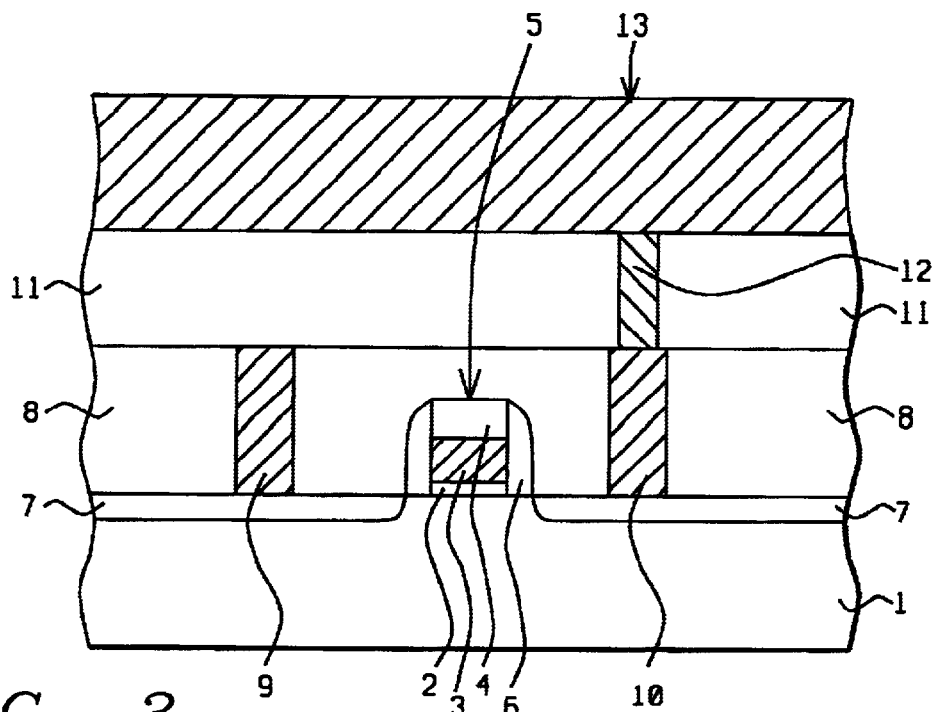
Figure 4:
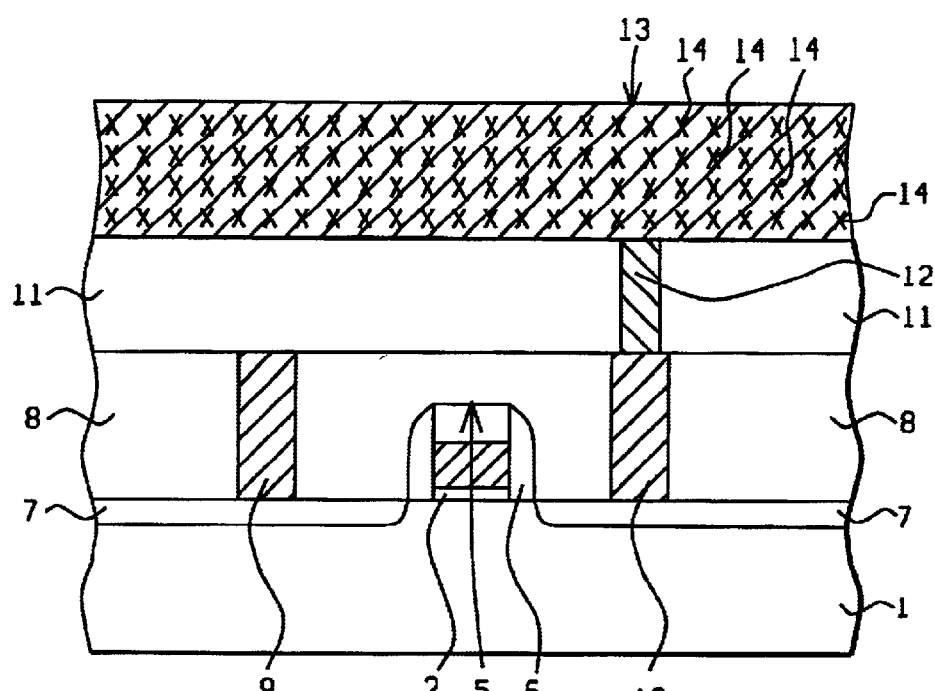

Intrinsically doped, polysilicon layer 13, shown schematically in FIG. 3, is next deposited via LPCVD procedures, at a thickness between about 3000 to 12000 Angstroms. A critical ion implantation procedure is next employed to form multiple veins of implanted ions, with each specific vein of implanted ions placed at a specific depth in intrinsic polysilicon layer 13. The veins of implanted ions, labelled 14, and schematically shown in FIG. 4, are achieved via multiple, blanket implantation procedures, using either arsenic or phosphorous ions. The number of specific ion implanted veins, can be between about 3 to 10, with the deepest vein created via implantation at an energy between about 50 to 100 KeV, while the shallowest, or the vein closest to the top surface of polysilicon layer 13, accomplished at an implantation energy between about 2 to 50 KeV. The veins of implanted ions, located between the deepest and shallowest veins, are obtained at energies between about 30 to 80 KeV. The implant dose for each of implanted veins 14, is between about 2E13 to 7E17 atoms/$cm^2$, while the intrinsic, or non-implanted space between implanted vein region, in polysilicon layer 13, is between about 100 to 5000 Angstroms. An anneal cycle can now be employed to activate the implanted ions.

Figure 5:
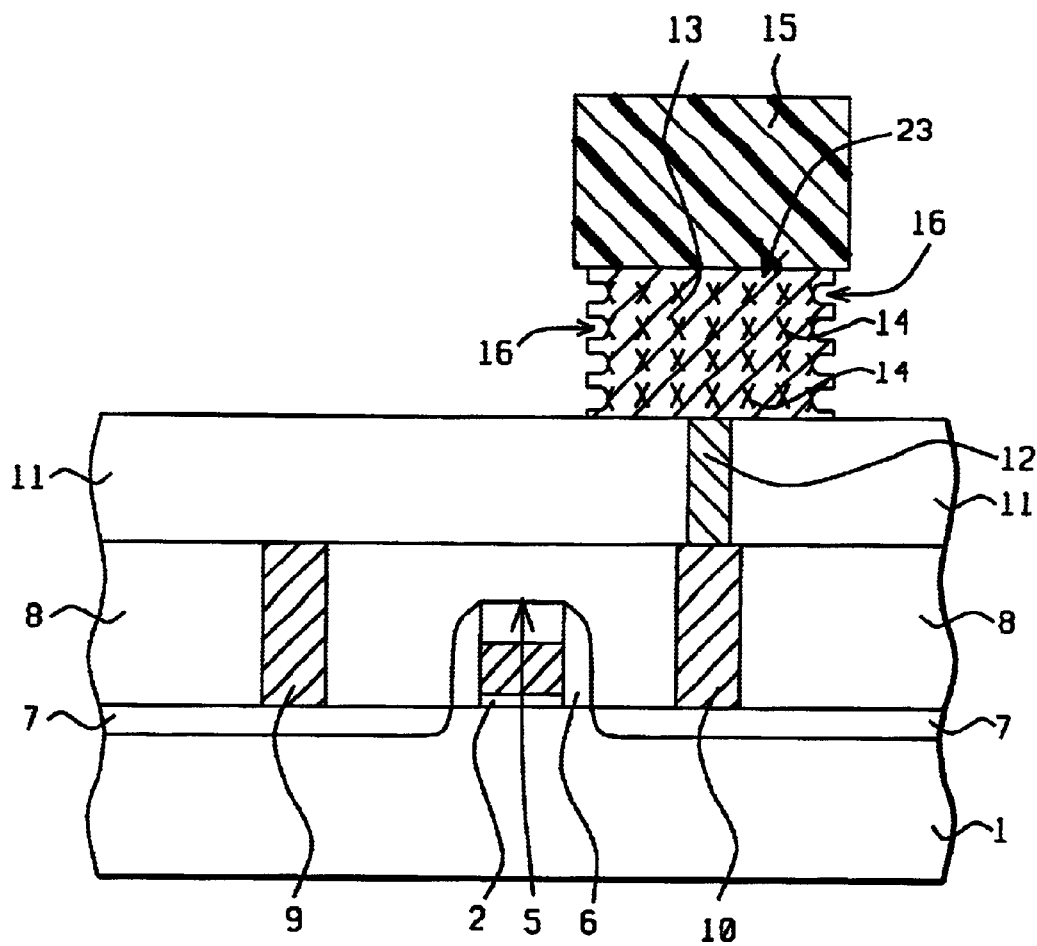

The formation of storage node structure 23, featuring a necked profile, is next addressed and schematically shown in FIG. 5. Photoresist shape 15, is formed on the top surface of polysilicon layer 13, and used as a etch mask to define storage node structure 23. A critical dry etch procedure, performed at specific conditions, is next employed to etch polysilicon layer 13, featuring an etch rate for portions of polysilicon comprised with ion implanted veins 14, greater than the etch rate for intrinsic regions of polysilicon, located between ion implanted veins 14. The dry etch procedure is performed using an inductive coupled plasma (ICP) procedure and tool, at a power for the top plate of the ICP tool between about 100 to 1000 watts, while a power between about 30 to 300 watts is used for the bottom plate. A pressure between about 4 to 50 mtorr, is employed, using an ambient comprised of $Cl_2$, HBr, and He as an etchant. These conditions result in a removal rate of intrinsic polysilicon of between about 600 to 1000 Angstroms/min, while the removal rate of polysilicon comprised with ion implanted veins 14, is greater, between about 1000 to 2000 Angstroms/min. In addition the dry etch conditions, specifically pressure, allow an isotopic component to be present, which in combination with the higher removal rate of implanted ions veins 14, result in a greater degree of lateral etching for implanted ion vein region, when compared to the smaller level of lateral etching experienced by the intrinsic polysilicon regions, thus resulting in the formation of lateral grooves 16, in ion implanted veins 14. The extent of lateral etching, or the lateral dimension of grooves 16, is between about 50 to 500 Angstroms, creating the necked profile for storage node structure 23. The increase in surface area for storage node structure 23, is between 2 to 4 times greater than counterpart storage node structures formed without notching.

Figure 6:
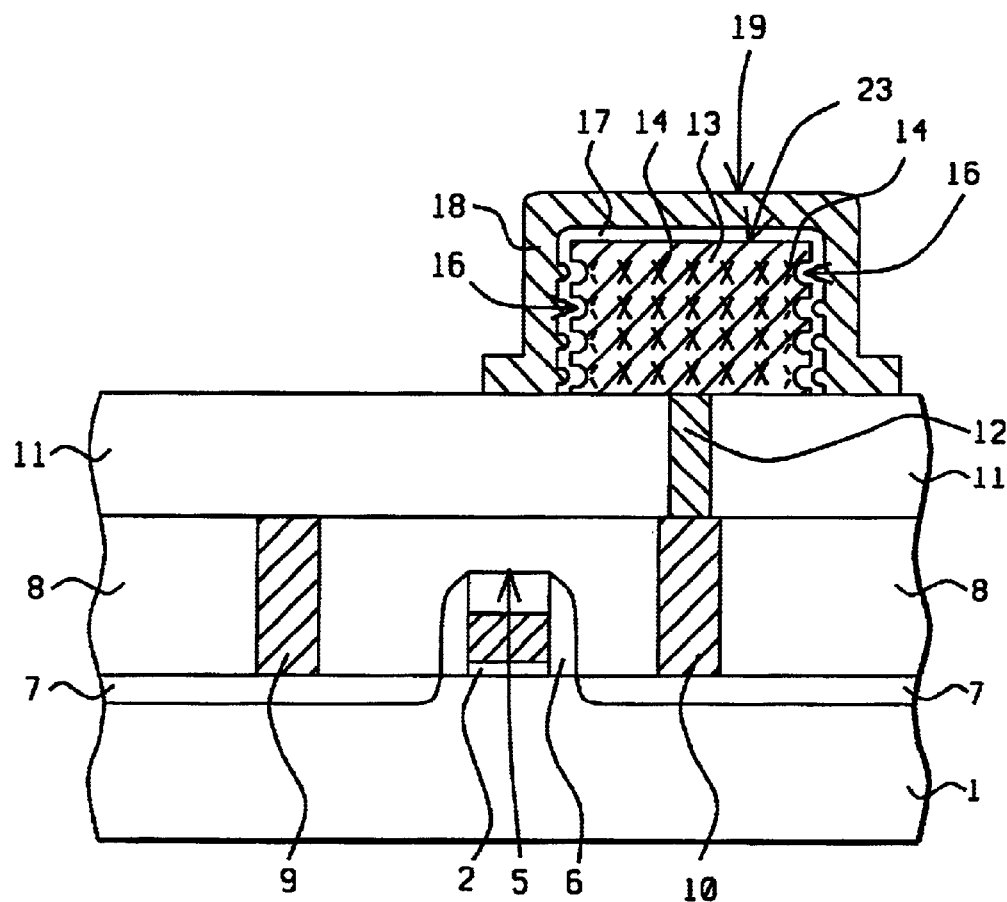

The completion of DRAM capacitor s 19, featuring storage node structure 23, with the desired necked profile, is next addressed and schematically shown in FIG. 6. After removal of photoresist shape 15, via plasma oxygen ashing, capacitor dielectric layer 17, is formed on the necked profile surface of storage node structure 23. Capacitor dielectric layer 17, can be a tantalum oxide layer obtained via plasma vapor deposition procedures, at a thickness between about 10 to 500 Angstroms. Capacitor dielectric layer 17, can also be an oxidized silicon nitride on silicon oxide (ONO) layer, or an oxidized silicon nitride (NO) layer, both at an equivalent silicon oxide thickness between about 10 to 100 Angstroms. A polysilicon layer is next deposited via LPCVD procedures at a thickness between about 50 to 500 Angstroms, doped in situ during deposition via the addition of arsine, or phosphine, to a silane ambient. A photoresist shape, not shown in the drawings, is next used as an etch mask to allow an anisotropic RIE procedure, using $Cl_2$ or $SF_6$ as an etchant, to define polysilicon upper electrode shape 18, completing the fabrication of DRAM capacitor structure 19, comprised of overlying, polysilicon upper electrode structure 18, capacitor dielectric layer 17, and storage node structure 23, in turn fearing a necked profile needed to increase capacitor ice area.

While this invention has been particularly shown and described with reference to the preferred embodiments thereof, it will be understood by those skilled in the art that various changes in form and details may be made without departing from the spirit or scope of the invention

What is claimed is:

1. A method of fabricating a capacitor structure for a dynamic random access memory (DRAM), device, on a semiconductor substrate, comprising the steps of:

providing a transfer gate transistor on said semiconductor substrate, comprised of a gate structure on an underlying gate insulator layer, and comprised with a source/drain region located in an area of said semiconductor substrate not covered by said gate structure;

forming a conductive plug structure in an opening in an insulator layer, with said conductive plug structure overlying and contacting a portion of a top surface of a source region;

depositing an intrinsic polysilicon layer on the top surface of said insulator layer, and on the top surface of said conductive plug structure;

performing a series of ion implantation procedures at various implantation energies, to create ion implanted veins at different depths in said intrinsic polysilicon layer, with regions of said intrinsic polysilicon layer located between said ion implanted veins remaining as intrinsic polysilicon regions;

performing a dry etch procedure to define a storage node structure from said intrinsic polysilicon layer, with an isotropic component of said dry etch procedure selectively etching lateral grooves in said ion implanted veins, resulting in a necked profile, storage node structure featuring said lateral grooves in the sides of said necked profile, storage node structure;

forming a capacitor dielectric layer on said necked profile, storage node structure; and forming an upper electrode structure on said capacitor dielectric layer resulting in said capacitor structure comprised of said upper electrode structure, of said capacitor dielectric layer, and of underlying, said necked profile, storage node structure.

2. The method of claim 1, wherein said insulator layer is a silicon oxide, or a boro-phosphosilicate layer, obtained via LPCVD or PECVD procedures, at a thickness between about 3000 to 12000 Angstroms.

3. The method of claim 1, wherein said opening in said insulator layer is formed via an anisotropic RIE procedure, performed using $CHF_3$ as an etchant for said insulator layer.

4. The method of claim 1, wherein said conductive plug structure is a polysilicon plug structure, obtained via deposition of an N type, in situ doped polysilicon layer via LPCVD procedures at a thickness between about 1000 to 7000 Angstroms, and defined via a chemical mechanical polishing procedure, removing unwanted portions of polysilicon from a top surface of said insulator layer.

5. The method of claim 1, wherein said intrinsic polysilicon layer is obtained via LPCVD procedures, at a thickness between about 3000 to 12000 Angstroms.

6. The method of claim 1, wherein said series of ion implantation procedures are performed at various implantation energies using either arsenic or phosphorous ions.

7. The method of claim 1, wherein said series of ion implantation procedures are performed using between about 3 to 10 specific energies.

8. The method of claim 1, wherein the lowest implantation energy used, resulting in the shallowest ion implanted vein in said intrinsic polysilicon layer, is performed at an energy between about 2 to 50 KeV, while the highest implantation energy used, resulting in the deepest ion implanted vein in said intrinsic polysilicon layer, is performed at an energy between about 50 to 100 KeV.

9. The method of claim 1, wherein the dose of implanted ions, used for the series of ion implantation procedures, is between about 2E13 to 7E17 atoms/$cm^2$.

10. The method of claim 1, wherein said dry etching procedure, used to define said necked profile, storage node structure, is performed via an inductive coupling plasma (ICP), procedure, with a top power for an ICP tool between about 100 to 1000 watts, a bottom plate at a power between about 30 to 300 watts, at a pressure between about 4 to 50 mtorr, and using an ambient comprised with $Cl_2$, HBr and He as an etchant.

11. The method of claim 1, wherein dry etching procedure results in a removal rate for said intrinsic polysilicon of between about 600 to 1000 Angstroms/min, while the removal rate of said ion implantation veins is between about 1000 to 2000 Angstroms/min.

12. The method of claim 1, wherein said lateral grooves in said ion implanted veins, formed during said dry etching procedure, are between about 50 to 500 Angstroms in length.

13. The method of claim 1, wherein the surface area of said necked profile, storage node structure is between about 2 to 4 times larger than a surface area for a flat surface, or a non-necked profile, storage node structure.

14. The method of claim 1, wherein said capacitor dielectric layer is a tantalum oxide layer, obtained via plasma vapor deposition procedures.

15. A method of fabricating a stacked capacitor structure for a dynamic random access memory (DRAM), device, on a semiconductor substrate, featuring a storage node structure comprised with lateral grooves located in the sides of said storage node structure, comprising the steps of:

providing a transfer gate transistor on said semiconductor substrate, comprised of a silicon nitride capped, polycide gate structure on an underlying silicon dioxide gate insulator layer, with insulator spacers located on the sides of said silicon nitride capped, polycide gate structure, and with a source/drain region located in an area of said semiconductor substrate not covered by said silicon nitride capped, polycide gate structure or by said insulator spacers;

forming a polysilicon plug structure in an opening in an insulator layer, with said polysilicon plug structure overlying and contacting a portion of a top surface of a source region;

depositing an intrinsic polysilicon layer on the top surface of said insulator layer, and on the top surface of said silicon plug structure;

performing multiple ion implantation procedures at various implantation energies, to create ion implanted veins, each located at a specific depth in said intrinsic polysilicon layer, and with regions of said intrinsic polysilicon layer, located between said ion implanted veins remaining as intrinsic polysilicon regions;

performing a dry etch procedure to define said storage node structure from said intrinsic polysilicon layer, with an isotropic component of said dry etch procedure selectively and laterally etching portions of said ion implanted vein regions exposed at the sides of said storage node structure, resulting in a necked profile, storage node structure featuring said lateral grooves in the sides of said necked profile, storage node structure;

forming a capacitor dielectric layer on exposed surfaces of said necked profile, storage node structure; and forming a polysilicon upper electrode structure on said capacitor dielectric layer, resulting in said stacked capacitor structure comprised of said polysilicon upper electrode structure, of said capacitor dielectric layer, and of underlying, said necked profile, storage node structure.

16. The method of claim 15, wherein said insulator layer is a silicon oxide, or a boro-phosphosilicate layer, obtained via LPCVD or PECVD procedures, at a thickness between about 3000 to 12000 Angstroms.

17. The method of claim 15, wherein said polysilicon plug structure is comprised of situ doped N type polysilicon, obtained at a thickness between about 1000 to 7000 Angstroms via LPCVD procedures, then defined via a chemical mechanical polishing procedure, removing unwanted portions of polysilicon from a top surface of said insulator layer.

18. The method of claim 15, wherein said intrinsic polysilicon layer is obtained via LPCVD procedures, at a thickness between about 3000 to 12000 Angstroms.

19. The method of claim 15, wherein said multiple ion implantation procedures are performed using either arsenic or phosphorous ions.

20. The method of claim 15, wherein the number of specific ion implantation procedures performed for said multiple ion implantation procedures, is between about 3 to 10.

21. The method of claim 15, wherein the lowest implantation energy used as part of said multiple ion implantation procedures, resulting in the shallowest ion implanted vein in said intrinsic polysilicon layer, is performed at an energy between about 2 to 50 KeV, while the highest implantation energy used with said multiple ion implantation procedures, resulting in the deepest ion implant vein in said intrinsic polysilicon layer, is performed at an energy between about 50 to 100 KeV.

22. The method of claim 15, wherein the dose of implanted ions, used for said multiple ion implantation procedure, is between about 2E13 to 7E17 atoms/cm$^2$.

23. The method of claim 15, wherein said dry etching procedure, used to define said necked profile, storage node structure, is an inductive coupling plasma (ICP) procedure, performed using an ICP tool, with a top plate power between about 100 to 1000 watts, with a bottom plate power between about 30 to 300 watts, at a pressure between about 4 to 50 mtorr, and using an ambient comprised with $Cl_2$, HBr and He as an etchant.

24. The method of claim 15, wherein said dry etching procedure results in a removal rate for said intrinsic polysilicon of between about 600 to 1000 Angstroms/min, while the removal rate of said ion implantation veins is between about 1000 to 2000 Angstroms/min.

25. The method of claim 15, wherein said lateral grooves located in said ion implanted veins, formed during said dry etching procedure, are between about 50 to 500 Angstroms in length.

26. The method of claim 15, wherein the source area of said necked profile, storage node structure is between about 2 to 4 times larger than a surface area for non-necked profile, storage node structure.

27. The method of claim 15, wherein said capacitor dielectric layer is a tantalum oxide layer, obtained via plasma vapor deposition procedures.

* * * * *